(12) United States Patent
Chen et al.

(10) Patent No.: US 7,786,504 B2
(45) Date of Patent: Aug. 31, 2010

(54) BIDIRECTIONAL PNPN SILICON-CONTROLLED RECTIFIER

(75) Inventors: Wen-Yi Chen, Taipei (TW); Ryan Hsin-Chin Jiang, Taipei (TW); Ming-Dou Ker, Jhu-bei (TW)

(73) Assignee: Amazing Microelectronic Corp., Taipei County (TW)

( * ) Notice: Subject to any disclaimer, the term of this patent is extended or adjusted under 35 U.S.C. 154(b) by 142 days.

(21) Appl. No.: 12/076,556

(22) Filed: Mar. 20, 2008

(65) Prior Publication Data
US 2009/0236631 A1    Sep. 24, 2009

(51) Int. Cl.
*H01L 29/74*    (2006.01)
(52) U.S. Cl. .................. 257/110; 257/109; 257/112; 257/121; 257/371; 257/372; 257/173; 257/355
(58) Field of Classification Search ............ 257/110, 257/109, 112, 121, 173, 371, 372, 355
See application file for complete search history.

(56) References Cited

U.S. PATENT DOCUMENTS

| | | | | |
|---|---|---|---|---|
| 4,300,152 A * | 11/1981 | Lepselter | ............... | 257/376 |
| 4,320,409 A * | 3/1982 | Shoji | ............... | 257/373 |
| 4,901,132 A * | 2/1990 | Kuwano | ............... | 257/134 |
| 5,072,273 A | 12/1991 | Avery | | |
| 6,074,899 A * | 6/2000 | Voldman | ............... | 438/155 |
| 6,258,634 B1 | 7/2001 | Wang et al. | | |
| 6,365,924 B1 | 4/2002 | Wang et al. | | |
| 6,420,221 B1 * | 7/2002 | Lee et al. | ............... | 438/199 |
| 6,956,266 B1 * | 10/2005 | Voldman et al. | ........... | 257/371 |
| 6,960,792 B1 | 11/2005 | Nguyen | | |
| 7,034,363 B2 | 4/2006 | Chen | | |
| 7,102,867 B2 * | 9/2006 | Voldman | ............... | 361/93.1 |
| 7,145,187 B1 | 12/2006 | Vashchenko et al. | | |
| 7,221,027 B2 * | 5/2007 | Lin | ............... | 257/355 |
| 7,304,354 B2 * | 12/2007 | Morris | ............... | 257/372 |
| 7,309,898 B1 * | 12/2007 | Singh et al. | ............... | 257/372 |
| 7,629,654 B2 * | 12/2009 | Morris | ............... | 257/372 |

\* cited by examiner

*Primary Examiner*—Viet Q Nguyen
(74) *Attorney, Agent, or Firm*—Rosenberg, Klein & Lee

(57) ABSTRACT

The present invention discloses a bidirectional PNPN silicon-controlled rectifier comprising: a p-type substrate; a N-type epitaxial layer; a P-type well and two N-type wells all formed inside the N-type epitaxial layer with the two N-type wells respectively arranged at two sides of the P-type well; a first semiconductor area, a second semiconductor area and a third semiconductor area all formed inside the P-type well and all coupled to an anode, wherein the second semiconductor area and the third semiconductor area are respectively arranged at two sides of the first semiconductor area, and wherein the first semiconductor area is of first conduction type, and the second semiconductor area and the third semiconductor area are of second conduction type; and two P-type doped areas respectively formed inside the N-type wells, wherein each P-type doped area has a fourth semiconductor area neighboring the P-type well and a fifth semiconductor area, and wherein both the fourth semiconductor area and the fifth semiconductor area are coupled to a cathode, and wherein the fourth semiconductor area is of second conduction type, and the fifth semiconductor area is of first conduction type.

3 Claims, 14 Drawing Sheets

BIDIRECTIONAL PNPN SILICON-CONTROLLED RECTIFIER

BACKGROUND OF THE INVENTION

1. Field of the Invention

The present invention relates to a silicon-controlled rectifier, particularly to a bidirectional PNPN silicon-controlled rectifier, which has a small area and a high ESD resistance.

2. Description of the Related Art

With the advance of semiconductor technology, the dimensions of MOS (Metal Oxide Semiconductor) elements have been reduced to a submicron or even deep-submicron scale. The submicron or deep-submicron technology uses so thin a gate oxide layer that only a few volts higher voltage is enough to cause damage. In common conditions, the voltage of electrostatic charge may reach thousands or even several ten thousands of volts, which will damage integrated circuits (IC). Therefore, once having accumulated to a given amount, electrostatic charge should be released. The silicon-controlled rectifier, which has a low turn-on resistance, low capacitance, low power consumption and high-power current conduction capability, is exactly an effective ESD (Electro-Static Discharge) protection element for IC.

Currently, bidirectional silicon-controlled rectifiers (SCR) have become the mainstream in the market of the ESD protection circuits for I/O ports subject to both positive and negative voltage signals, and many researches are also dedicated to bidirectional silicon-controlled rectifiers. U.S. Pat. Nos. 6,258,634, 6,365,924 and 7,034,363 all disclosed symmetric bidirectional silicon-controlled rectifiers. As the silicon-controlled rectifiers disclosed in the abovementioned patents are all directly fabricated on a silicon substrate, they have lower breakdown voltages and can only apply to common IC processes. A U.S. Pat. No. 6,960,792 disclosed an annular-layout symmetric bidirectional silicon-controlled rectifier. Such a technology needs a larger layout area. Further, the trigger speed is also deeply influenced by the structure thereof. Therefore, this technology cannot provide an effective ESD protection function. A U.S. Pat. No. 5,072,273 disclosed a low trigger voltage silicon-controlled rectifier. However, it can only operate unidirectionally. A U.S. Pat. No. 7,145,187 disclosed a special silicon-controlled rectifier. However, it is hard to mass fabricate and lacks utility.

Accordingly, the present invention proposes a novel bidirectional PNPN silicon-controlled rectifier to overcome the abovementioned problems.

SUMMARY OF THE INVENTION

The primary objective of the present invention is to provide a bidirectional PNPN silicon-controlled rectifier (SCR), which centers at an anode structure and has symmetric cathode structures respectively at two sides of the anode structure to reduce the area of the entire PNPN SCR architecture.

Another objective of the present invention is to provide a bidirectional PNPN silicon-controlled rectifier, which has an adjustable trigger voltage and an adjustable hold voltage.

Still another objective of the present invention is to provide a bidirectional PNPN silicon-controlled rectifier, which can be effectively integrated into a high-voltage device.

Further another objective of the present invention is to provide a bidirectional PNPN silicon-controlled rectifier, which has a low parasitic capacitance and a high ESD resistance, whereby the influence of SCR parasitic capacitance on the speed of circuit operation can be greatly reduced.

To achieve the abovementioned objectives, the present invention proposes a bidirectional PNPN silicon-controlled rectifier, which comprises: a P-type substrate; a N-type epitaxial layer formed on the substrate; a P-type well and a N-type well both formed inside the N-type epitaxial layer; a first semiconductor area and a second semiconductor area both formed inside the P-type well and coupled to an anode, wherein a conduction type of said second semiconductor area is opposite to that of said first semiconductor area; and a P-type doped area formed inside the N-type well, wherein the P-type doped area has a third semiconductor area and a fourth semiconductor area, and wherein the third semiconductor area and the fourth semiconductor area are both coupled to a cathode, and wherein a conduction type of said third semiconductor area is opposite to that of said fourth semiconductor area.

The present invention also proposes a bidirectional PNPN silicon-controlled rectifier, which comprises: a P-type substrate; a N-type epitaxial layer formed on the substrate; a P-type well and two N-type wells all formed inside the N-type epitaxial layer with the two N-type wells respectively arranged at two sides of the P-type well; a first semiconductor area, a second semiconductor area and a third semiconductor area all formed inside the first conduction type well and all coupled to an anode, wherein the first semiconductor area is arranged in between the second semiconductor area and the third semiconductor area, and wherein a conduction type of said first semiconductor area is opposite to that of said second and third semiconductor area; and two P-type doped areas respectively formed inside the N-type wells and arranged at two sides of the P-type well, wherein each P-type doped area has a fourth semiconductor area neighboring the P-type well and a fifth semiconductor area, and wherein both the fourth semiconductor area and the fifth semiconductor area are coupled to a cathode, and wherein a conduction type of said fourth semiconductor area is opposite to that of said fifth semiconductor area.

The present invention also proposes a bidirectional PNPN silicon-controlled rectifier, wherein a P-type middle doped area replaces the abovementioned P-type well.

The present invention also proposes a bidirectional PNPN silicon-controlled rectifier, which further comprises a P-type middle doped area formed inside the P-type well and encircling the first semiconductor area, the second semiconductor area and the third semiconductor area.

The present invention also proposes- a bidirectional PNPN silicon-controlled rectifier, which comprises: a P-type substrate; a N-type epitaxial layer formed on the substrate; a N-type buried layer formed in the junction between the substrate and the N-type epitaxial layer; a P-type well and two N-type wells all formed inside the N-type epitaxial layer and over the N-type buried layer with the two N-type wells respectively arranged at two sides of the P-type well; a P-type middle doped area formed inside the P-type well; a first semiconductor area, a second semiconductor area and a third semiconductor area all formed inside the P-type middle doped area and all coupled to an anode, wherein the first semiconductor area is arranged in between the second semiconductor area and the third semiconductor area, and wherein a conduction type of said first semiconductor area is opposite to that of said second and third semiconductor area; and two P-type doped areas respectively formed inside the N-type wells, wherein each P-type doped area has a fourth semiconductor area neighboring the P-type middle doped area and a fifth semiconductor area, and wherein both the fourth semiconductor area and the fifth semiconductor area are coupled to a cathode, and wherein a conduction type of said fourth semiconductor area is opposite to that of said fifth semiconductor area.

Below, the embodiments are described in detail to make easily understood the objectives, technical contents, characteristics and accomplishments of the present invention.

DETAILED DESCRIPTION OF THE INVENTION

The present invention proposes bidirectional PNPN silicon-controlled rectifiers (SCR). Below, a bidirectional PNPN SCR, which has one anode structure and only one cathode structure, is to be introduced as the fundamental architecture of the present invention.

Figure 1:
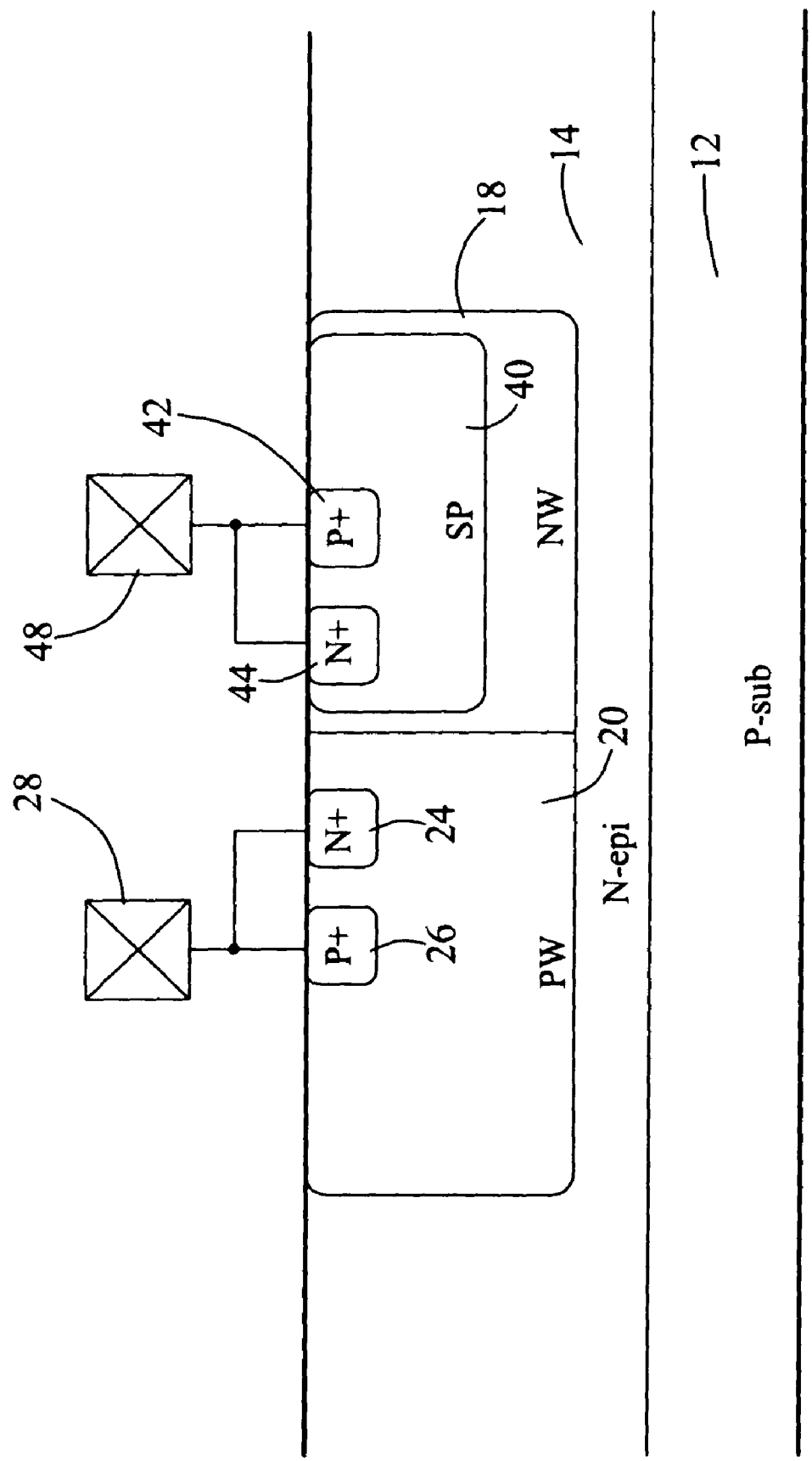
FIG. 1 is a diagram schematically showing a first embodiment of the present invention.

Refer to FIG. 1 a diagram schematically showing a first embodiment of the present invention. In the first embodiment of the present invention, the SCR structure comprises a P-type substrate 12; an N-type epitaxial layer 14 is formed on the P-type substrate 12; an N-type well 18 and a P-type well 20 are formed inside the N-type epitaxial layer 14, and the N-type well 18 is arranged at the right side of the P-type well 20.

The P-type well 20 has an N+ semiconductor area 24 and a P+ semiconductor area 26, and the N+ semiconductor area 24 is arranged at the side near the N-type well 18. The N+ semiconductor area 24 and P+ semiconductor area 26 are both coupled to an anode 28. Thus is formed an anode structure, which includes: the P-type well 20, the N+ semiconductor area 24 and the P+ semiconductor area 26.

The N-type well 18 has a P-type doped area 40 thereinside. The P-type doped area 40 has a P+ semiconductor area 42 and an N+ semiconductor area 44, and the N+ semiconductor area 44 is arranged at the side near the P-type well 20. The P+ semiconductor area 42 and the N+ semiconductor area 44 are both coupled to a cathode 48. Thus is formed a cathode structure, which includes: the N-type well 18, the P-type doped area 40, the P+ semiconductor area 42 and the N+ semiconductor area 44. In FIG. 1, the N-type well 18 is arranged at the right side of the P-type well 20. However, the N-type well may also be arranged at the left side of the P-type well. In such a case, the N+ semiconductor area of the P-type well is also arranged at the side near the N-type well, and the N+ semiconductor area of the N-type well is also arranged at the side near the P-type well.

Next is to be introduced a bidirectional PNPN SCR, which centers at an anode structure and has symmetric cathode structures respectively at two sides of the anode structure to reduce the area of the entire PNPN SCR architecture.

Figure 2:
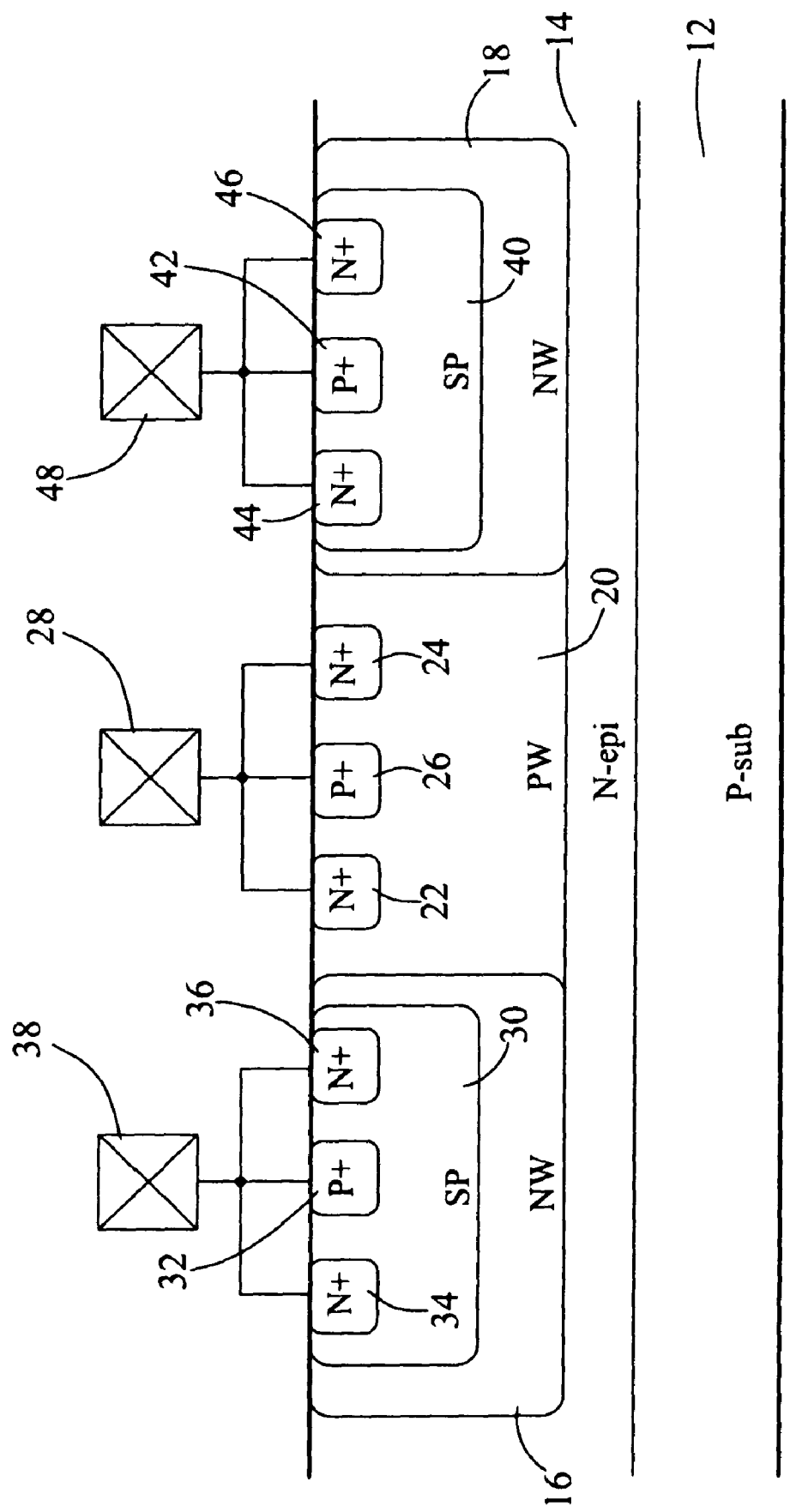
FIG. 2 is a diagram schematically showing a second embodiment of the present invention.

Refer to FIG. 2 a diagram schematically showing a second embodiment of the present invention. The bidirectional PNPN SCR of the present invention comprises a P-type substrate 12. An N-type epitaxial layer 14 is formed on the P-type substrate 12. Two N-type wells 16 and 18 and a P-type well 20 are formed inside the N-type epitaxial layer 14, and the P-type well 20 is interposed between the N-type wells 16 and 18. The P-type well 20 has two N+ semiconductor areas 22 and 24 and a P+ semiconductor area 26 arranged in between the N+ semiconductor areas 22 and 24. The N+ semiconductor areas 22 and 24 and the P+ semiconductor area 26 are all coupled to an anode 28. Thus is formed an anode structure, which includes: the P-type well 20, the N+ semiconductor areas 22 and 24 and the P+ semiconductor area 26.

The N-type well 16 has a P-type doped area 30 thereinside. The P-type doped area 30 has a P+ semiconductor area 32 and two N+ semiconductor areas 34 and 36 respectively at two sides of the P+ semiconductor area 32. The P+ semiconductor area 32 and the N+ semiconductor areas 34 and 36 are all coupled to a cathode 38. Thus is formed a first cathode structure, which includes: the N-type well 16, the P+ semiconductor area 32 and the N+semiconductor areas 34 and 36.

The N-type well 18 has a P-type doped area 40 thereinside. The P-type doped area 40 has a P+ semiconductor area 42 and two N+ semiconductor areas 44 and 46 respectively at two sides of the P+ semiconductor area 42. The P+ semiconductor area 42 and the N+ semiconductor areas 44 and 46 are all coupled to a cathode 48. Thus is formed a second cathode structure, which includes: the N-type well 18, the P+ semiconductor area 42 and the N+ semiconductor areas 44 and 46.

It can be seen in the embodiment described above that the bidirectional PNPN SCR of the present invention centers at an anode structure and has symmetric cathode structures (a first cathode structure and a second cathode structure) respectively at two sides of the anode structure. Thereby, the layout area of the entire bidirectional SCR is reduced, and the trigger voltage and hold voltage are made adjustable. In such a structure, the reliability of gate oxide is maintained in a high voltage application. Therefore, the present invention can be easily integrated into a high voltage device.

Similar to the structure shown in FIG. 1, the structures, wherein the N-type well is arranged at the right side of the P-type well, are used to exemplify the following embodiments, which also have one anode structure and only one cathode structure.

Figure 3A:
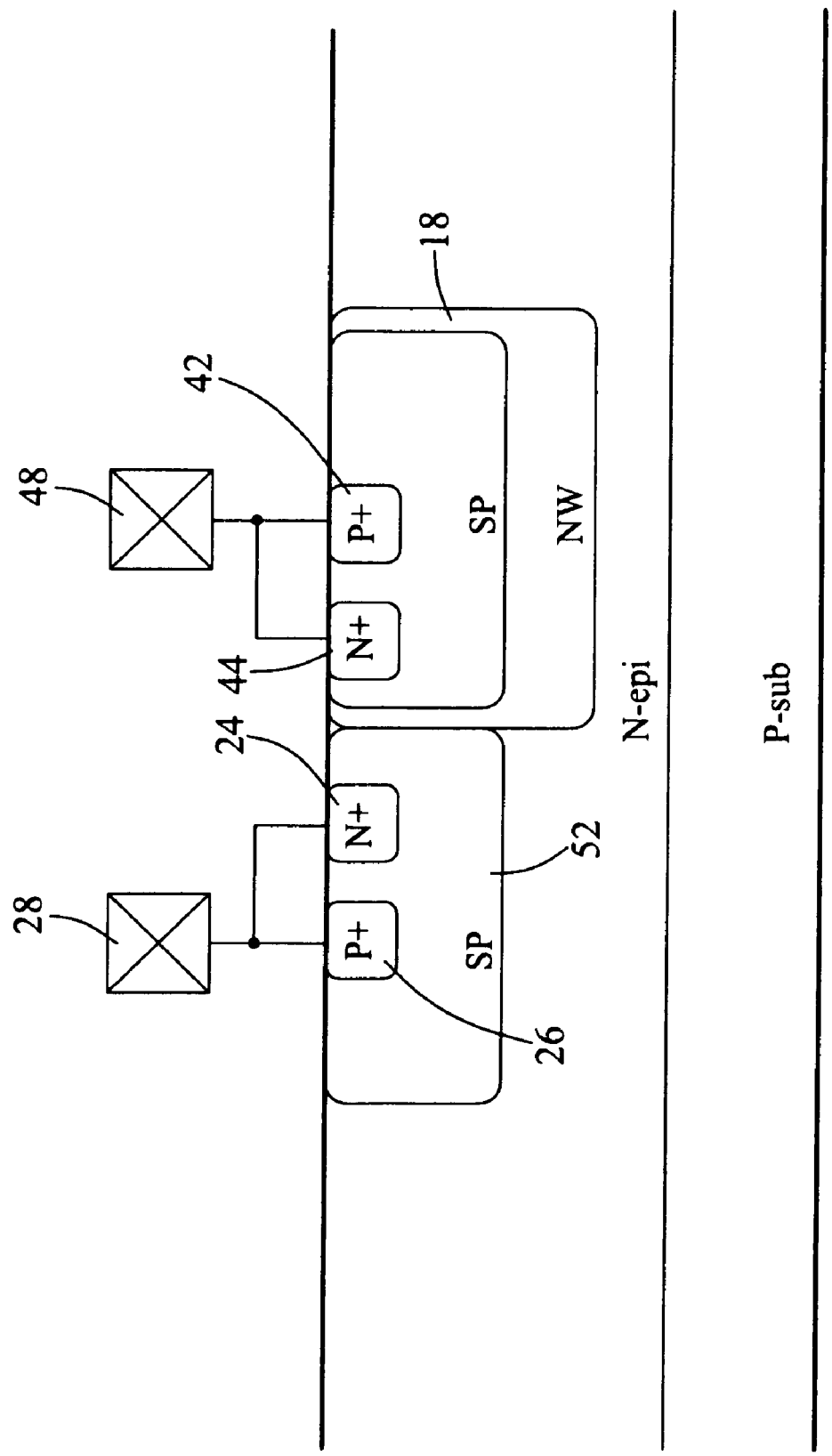
FIG. 3A is a diagram schematically showing one aspect of a third embodiment of the present invention.
Figure 3B:
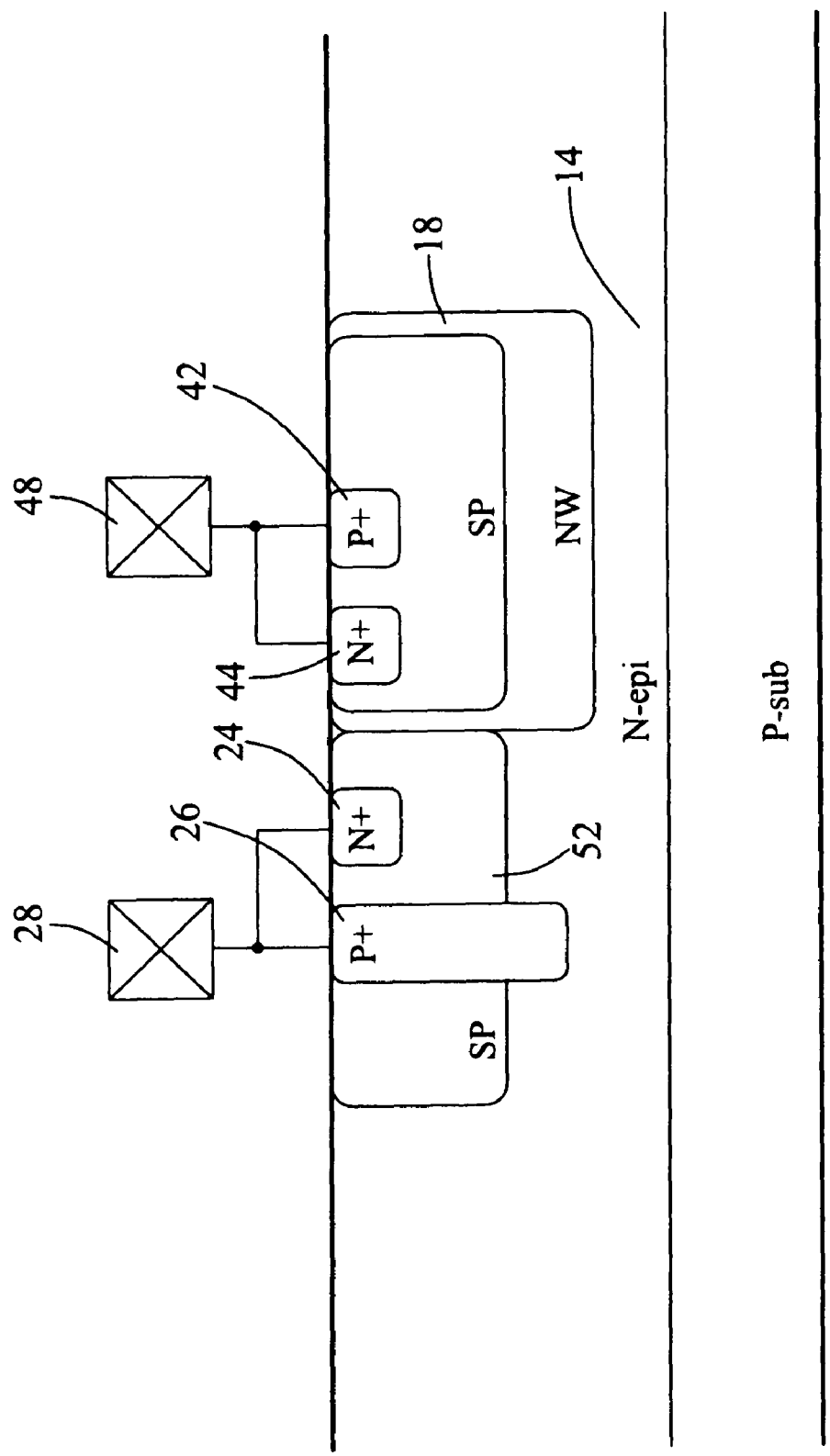
FIG. 3B is a diagram schematically showing another aspect of the third embodiment of the present invention.

Refer to FIG. 3A a diagram schematically showing one aspect of a third embodiment of the present invention. Based on the first embodiment shown in FIG. 1, a middle P-type doped area 52 replaces the P-type well 20 in FIG. 1. Refer to FIG. 3B a diagram schematically showing another aspect of the third embodiment of the present invention, wherein the P+ semiconductor area 26 extends through the boundary of the middle P-type doped area 52 and the N-type epitaxial layer 14.

Figure 4A:
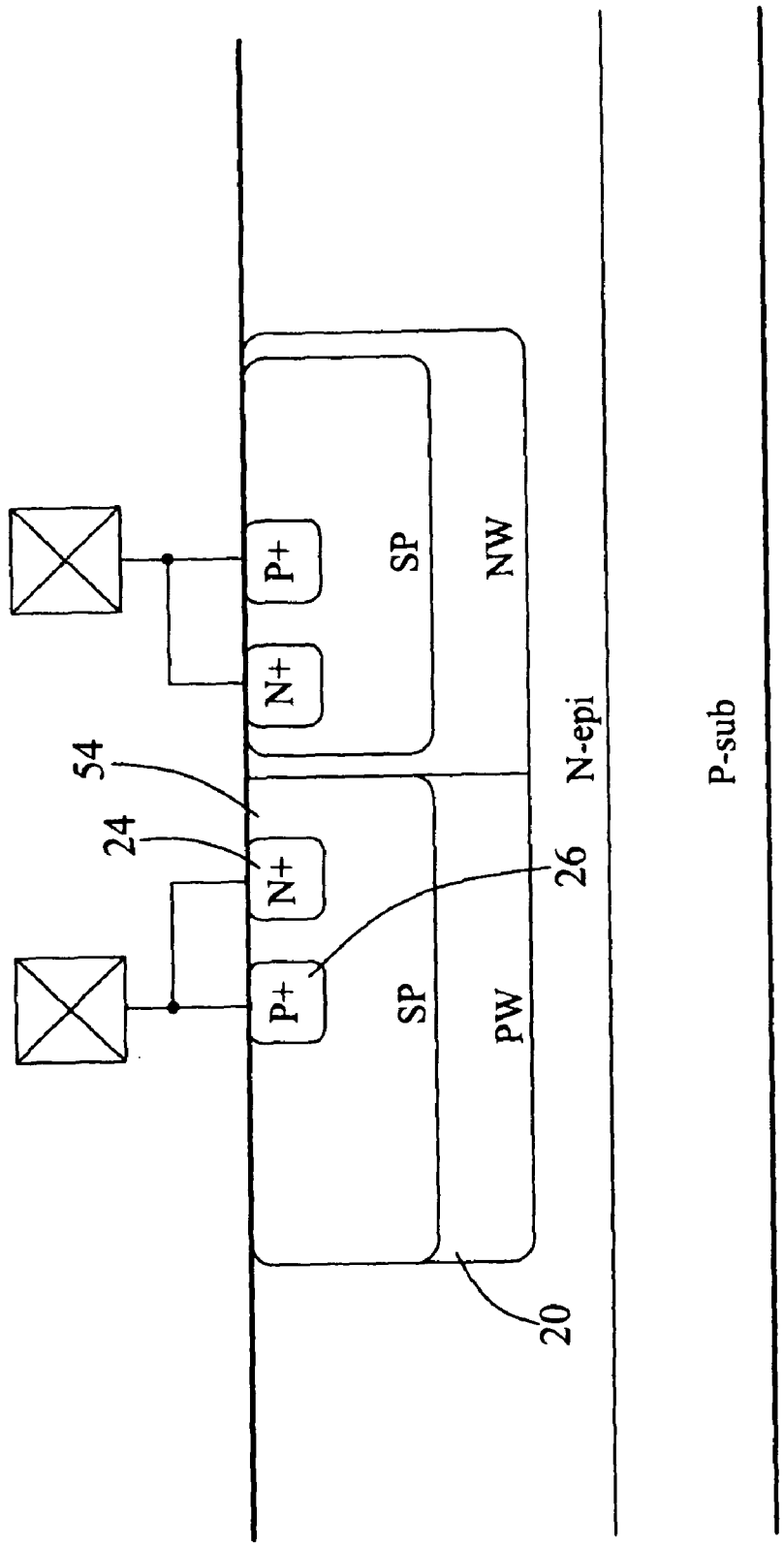
FIG. 4A is a diagram schematically showing one aspect of a fourth embodiment of the present invention.
Figure 4B:
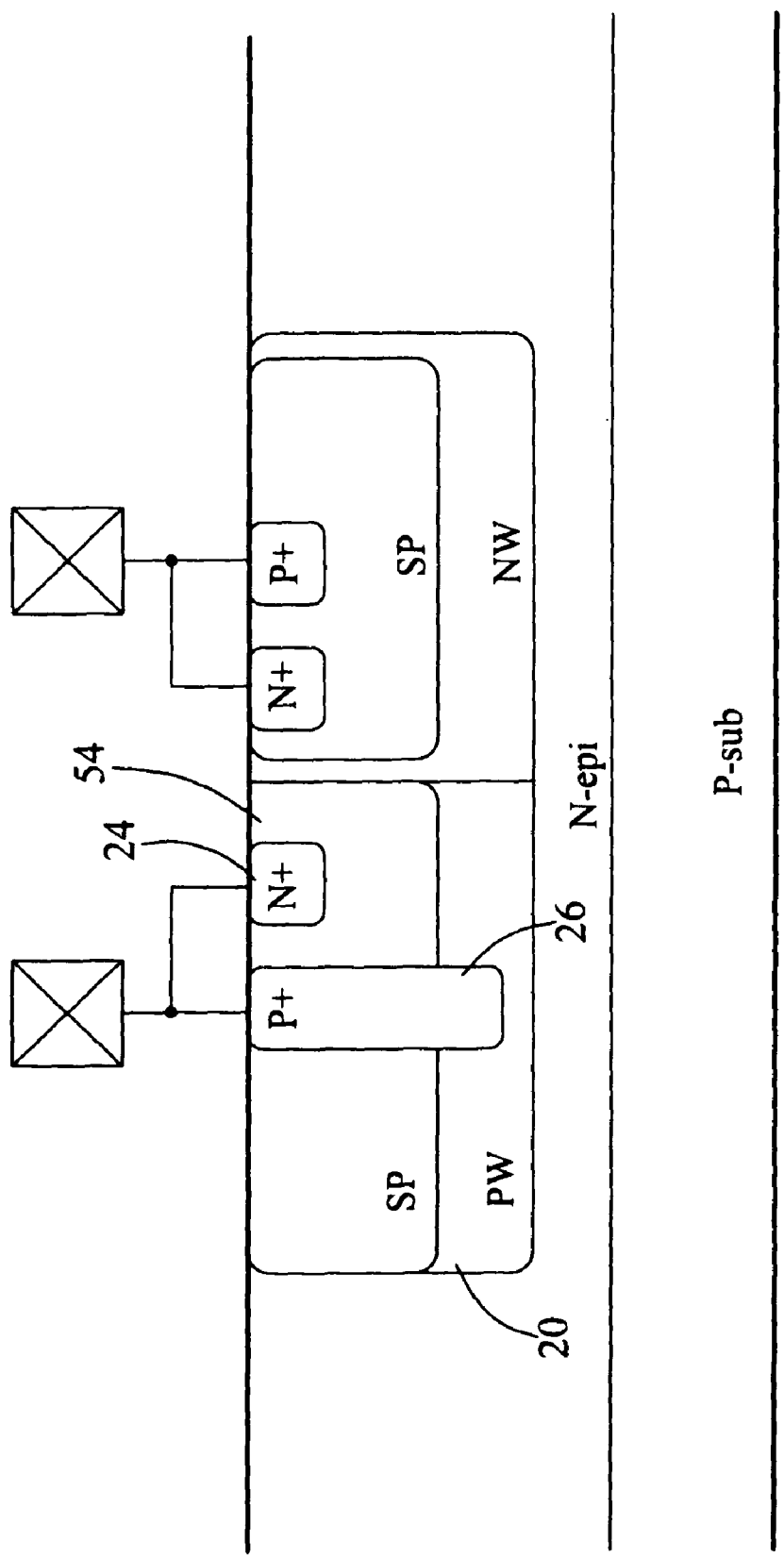
FIG. 4B is a diagram schematically showing another aspect of the fourth embodiment of the present invention.

Refer to FIG. 4A a diagram schematically showing one aspect of a fourth embodiment of the present invention. Based on the first embodiment shown in FIG. 1, a middle P-type doped area 54 is formed inside the P-type well 20 and encircles the N+ semiconductor area 24 and the P+ semiconductor area 26 in the fourth embodiment. Refer to FIG. 4B a diagram schematically showing another aspect of the fourth embodiment of the present invention, wherein the P+ semiconductor area 26 extends through the interface between the middle P-type doped area 54 and the P-type well 20.

Figure 5A:
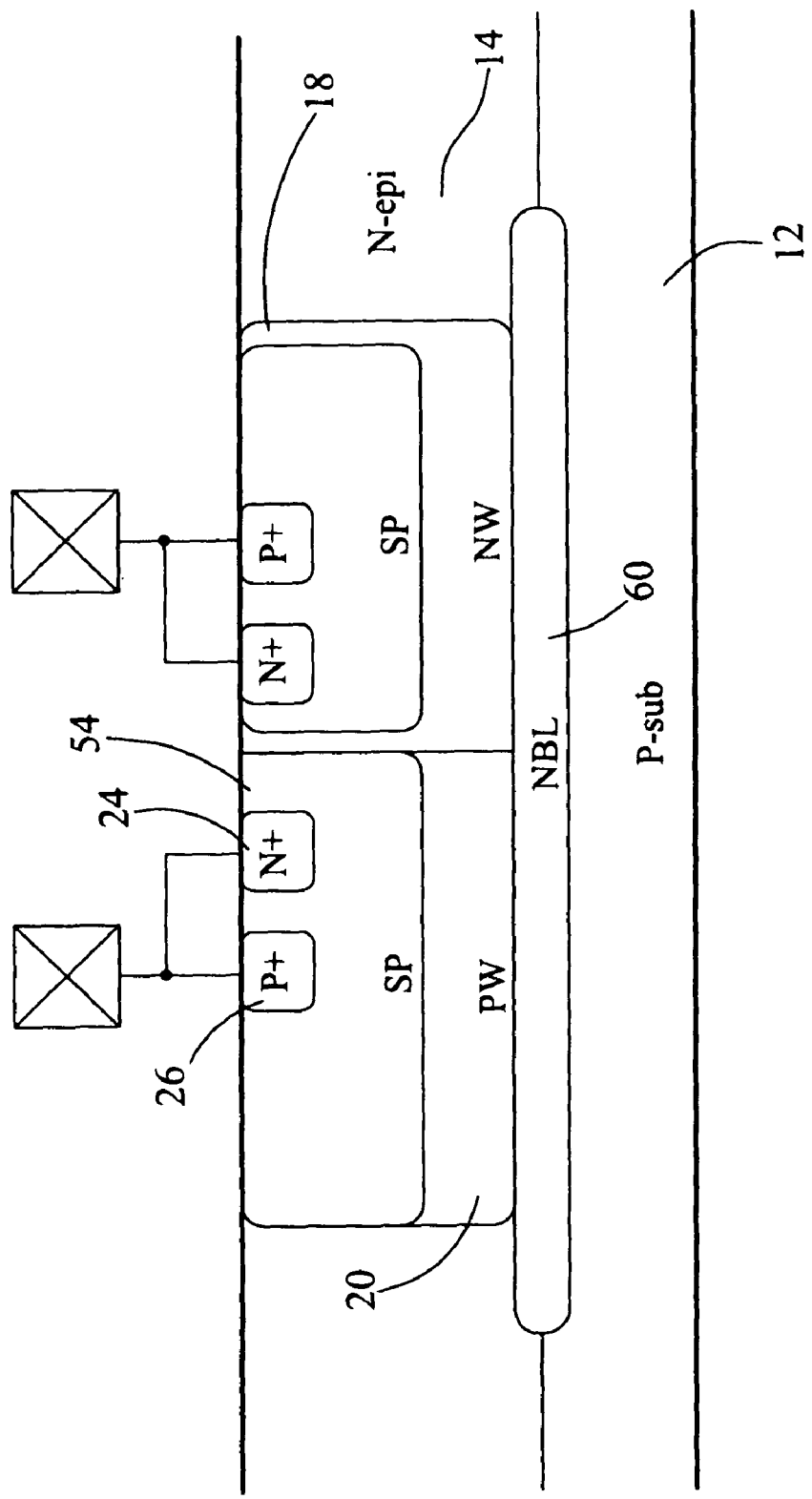
FIG. 5A is a diagram schematically showing one aspect of a fifth embodiment of the present invention.
Figure 5B:
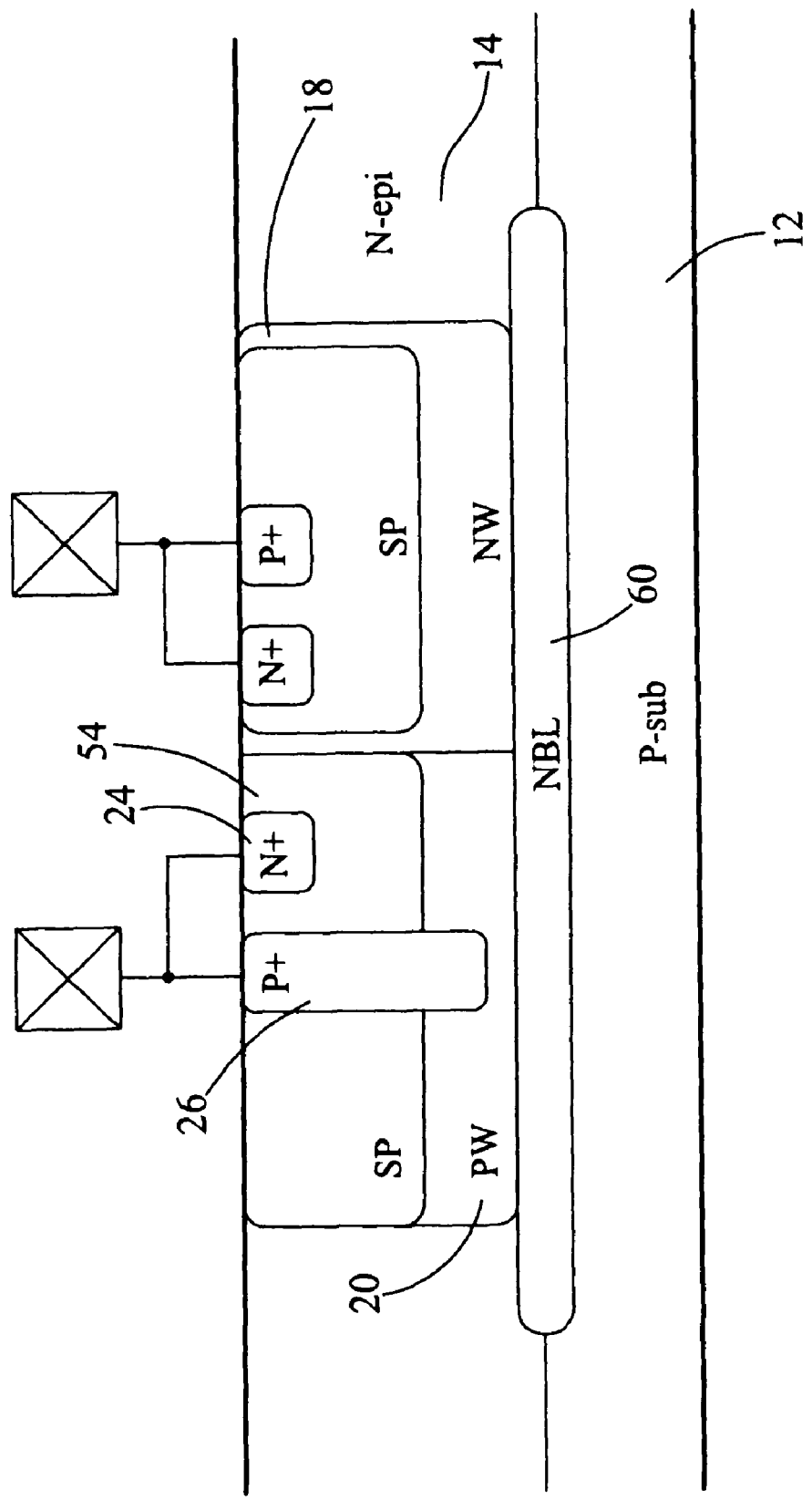
FIG. 5B is a diagram schematically showing another aspect of the fifth embodiment of the present invention.

Refer to FIG. 5A a diagram schematically showing one aspect of a fifth embodiment of the present invention. Based on the fourth embodiment shown in FIG. 4A, an N-type buried layer 60 is formed in the junction between the P-type substrate 12 and the N-type epitaxial layer 14, and the N-type well 18 and P-type well 20 are formed over the N-type buried layer 60 and inside the N-type epitaxial layer 14, in the fifth embodiment. Refer to FIG. 5B a diagram schematically showing another aspect of the fifth embodiment of the present invention, wherein the P+ semiconductor area 26 extends through the interface between the middle P-type doped area 54 and the P-type well 20.

Figure 6A:
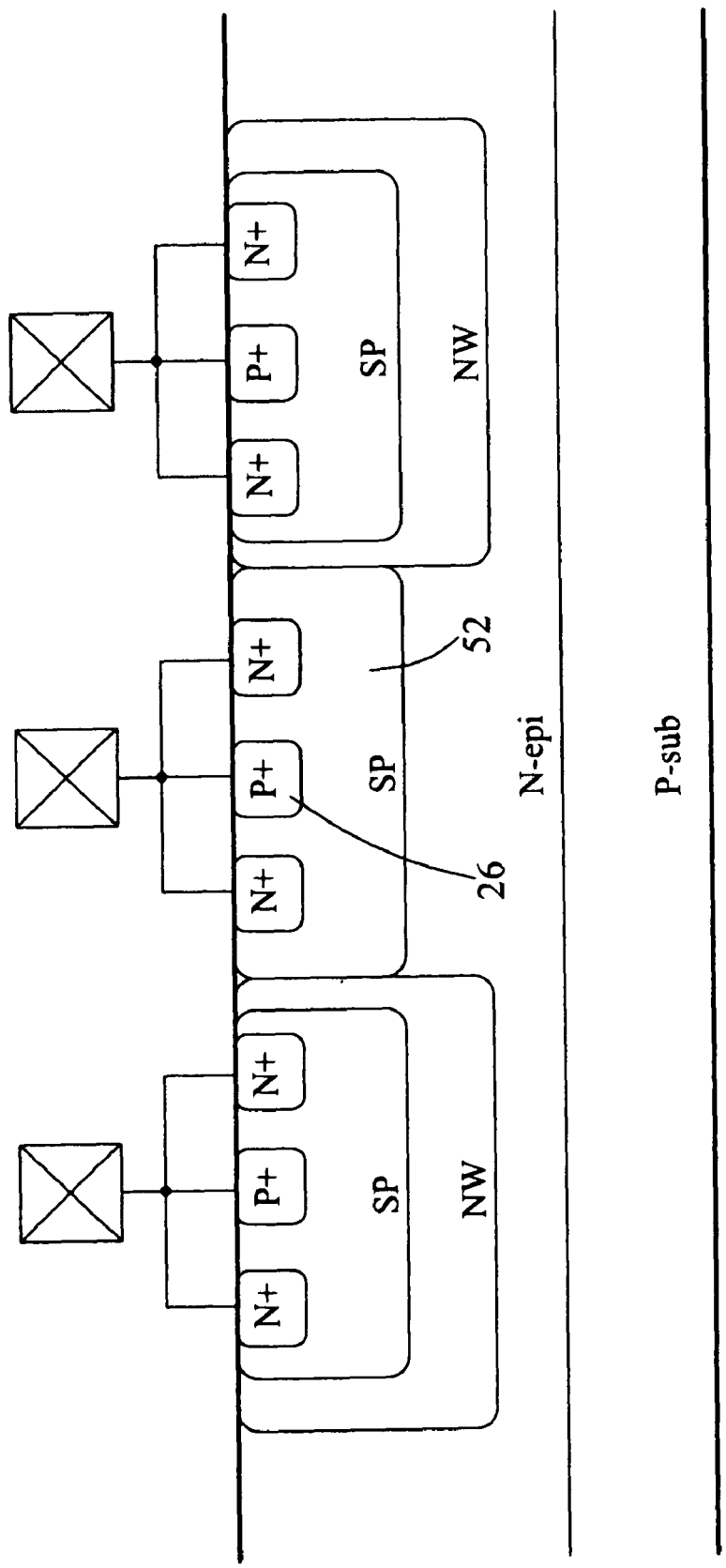
FIG. 6A is a diagram schematically showing one aspect of a sixth embodiment of the present invention.
Figure 6B:
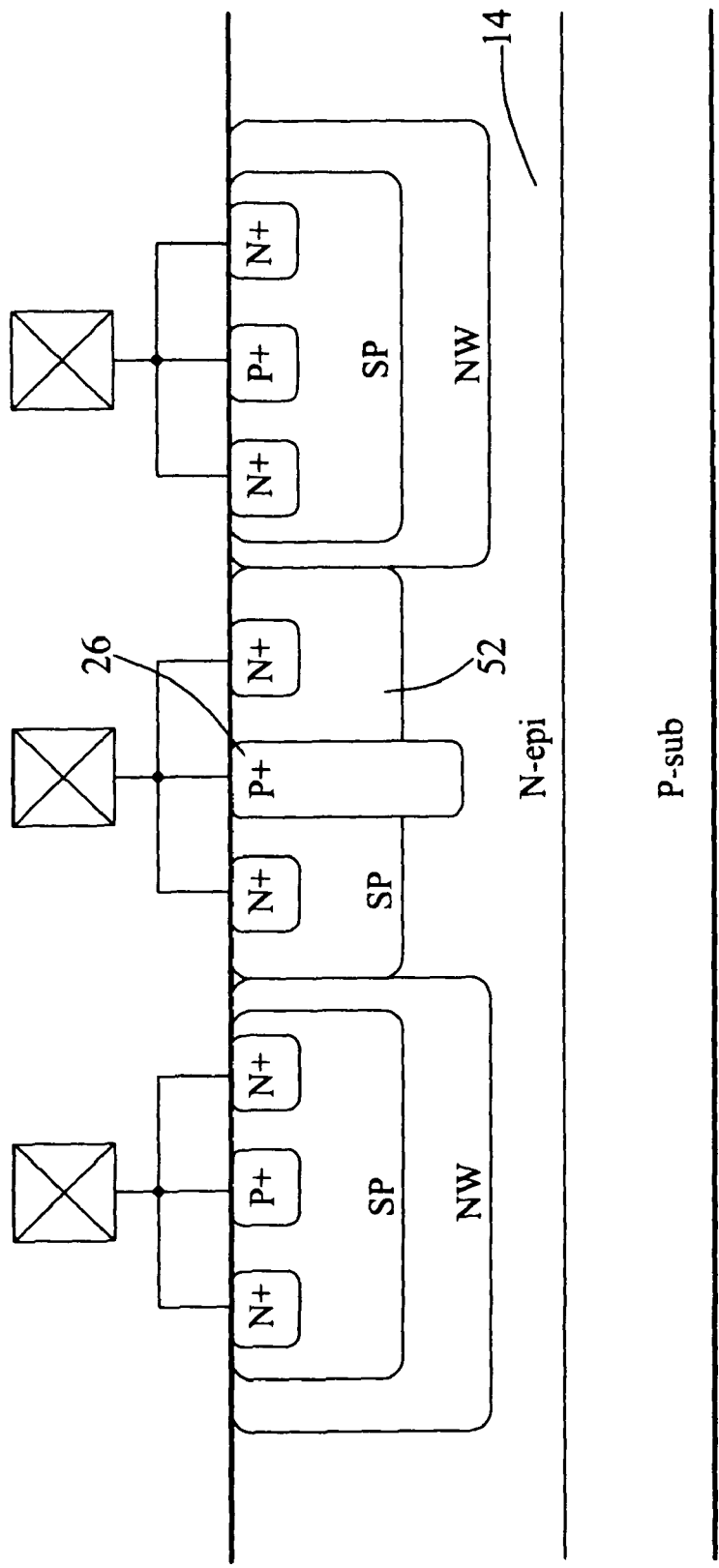
FIG. 6B is a diagram schematically showing another aspect of the sixth embodiment of the present invention.

Refer to FIG. 6A a diagram schematically showing one aspect of a sixth embodiment of the present invention, wherein a middle P-type doped area 52 replaces the P-type well 20 in FIG. 2. Refer to FIG. 6B a diagram schematically showing another aspect of the sixth embodiment of the present invention, wherein the P+ semiconductor area 26 extends through the boundary of the middle P-type doped area 52 and the N-type epitaxial layer 14.

Figure 7A:
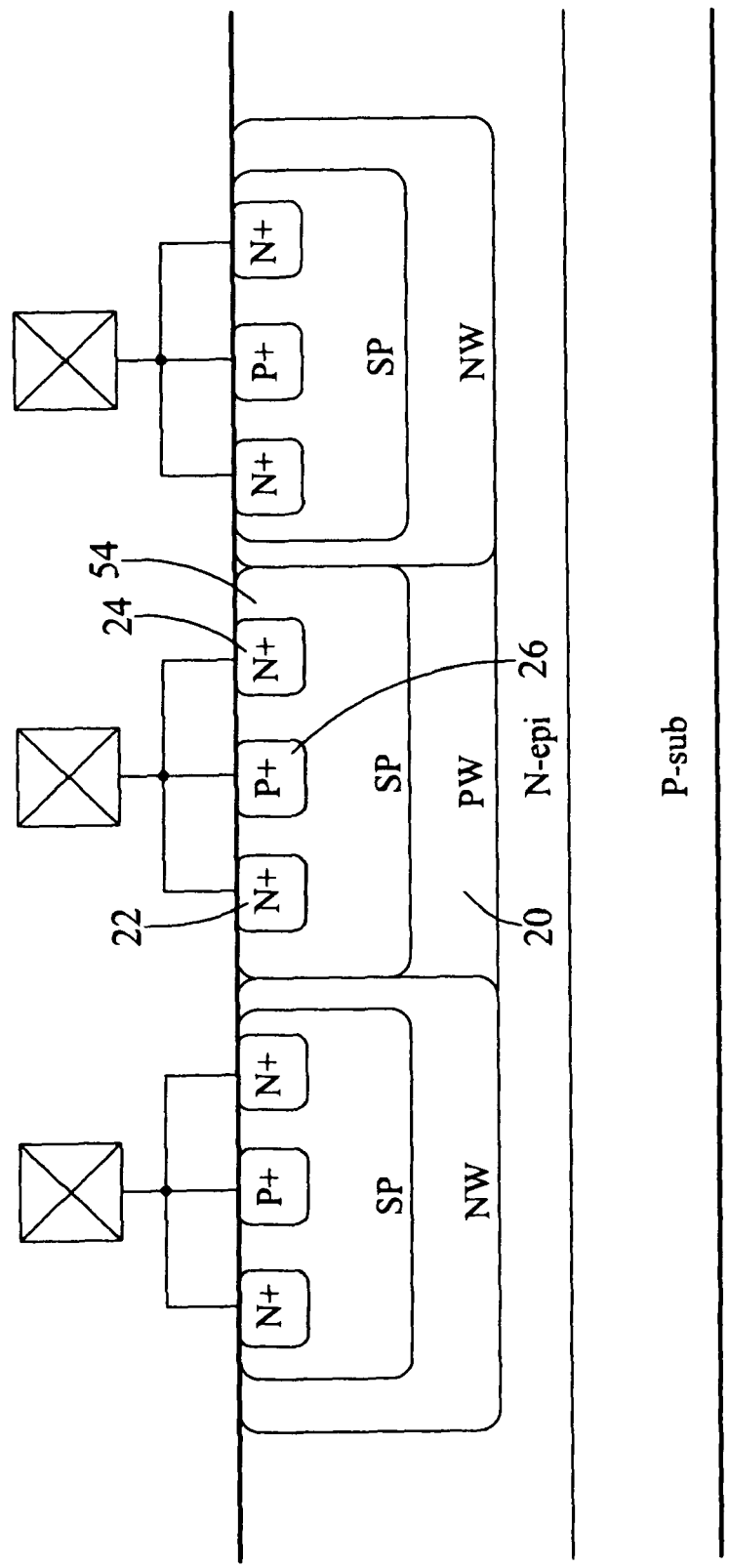
FIG. 7A is a diagram schematically showing one aspect of a seventh embodiment of the present invention.
Figure 7B:
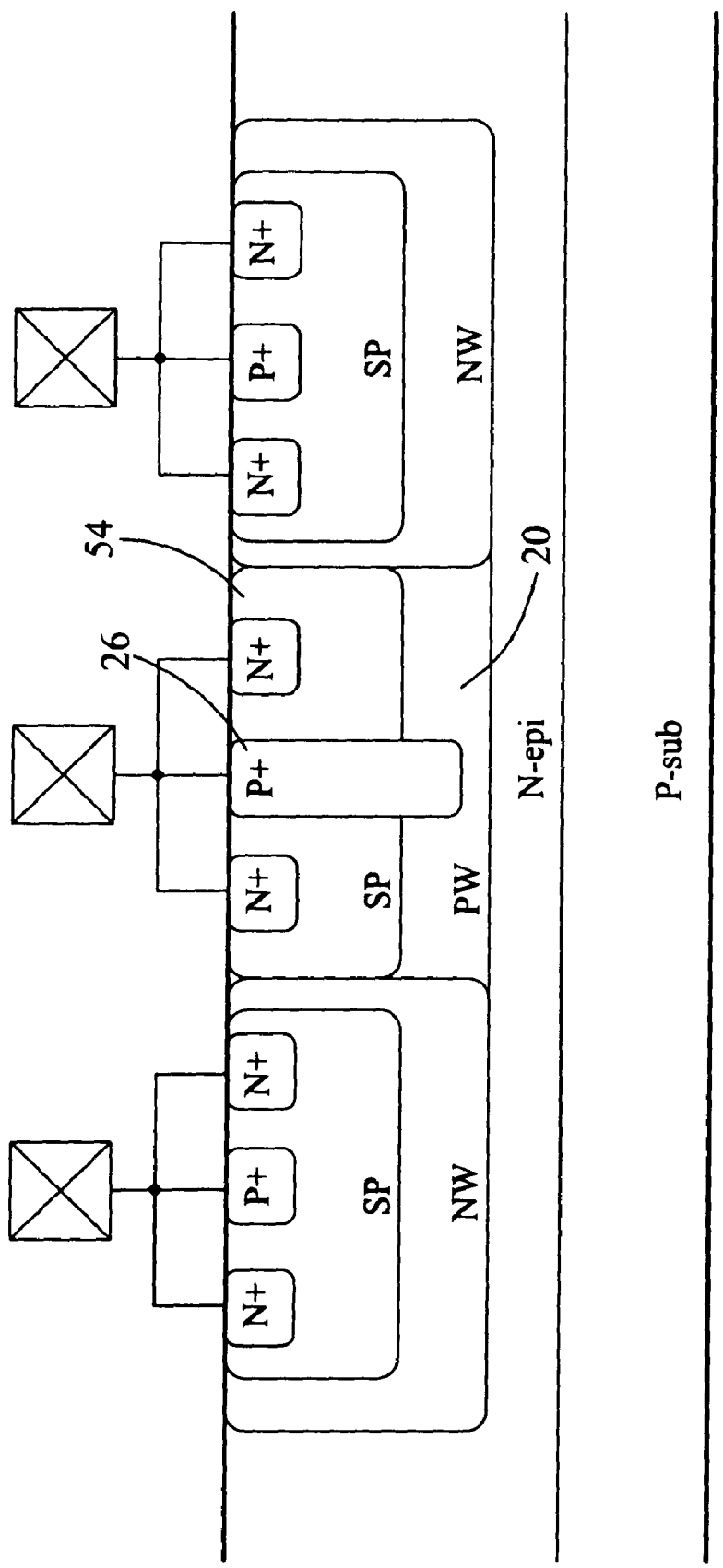
FIG. 7B is a diagram schematically showing another aspect of the seventh embodiment of the present invention.

Refer to FIG. 7A a diagram schematically showing one aspect of a seventh embodiment of the present invention, wherein a middle P-type doped area 54 is formed inside the P-type well 20 and encircles the N+ semiconductor areas 22 and 24 and the P+ semiconductor area 26. Refer to FIG. 7B a diagram schematically showing another aspect of the seventh embodiment of the present invention, wherein the P+ semiconductor area 26 extends through the interface between the middle P-type doped area 54 and the P-type well 20.

Figure 8A:
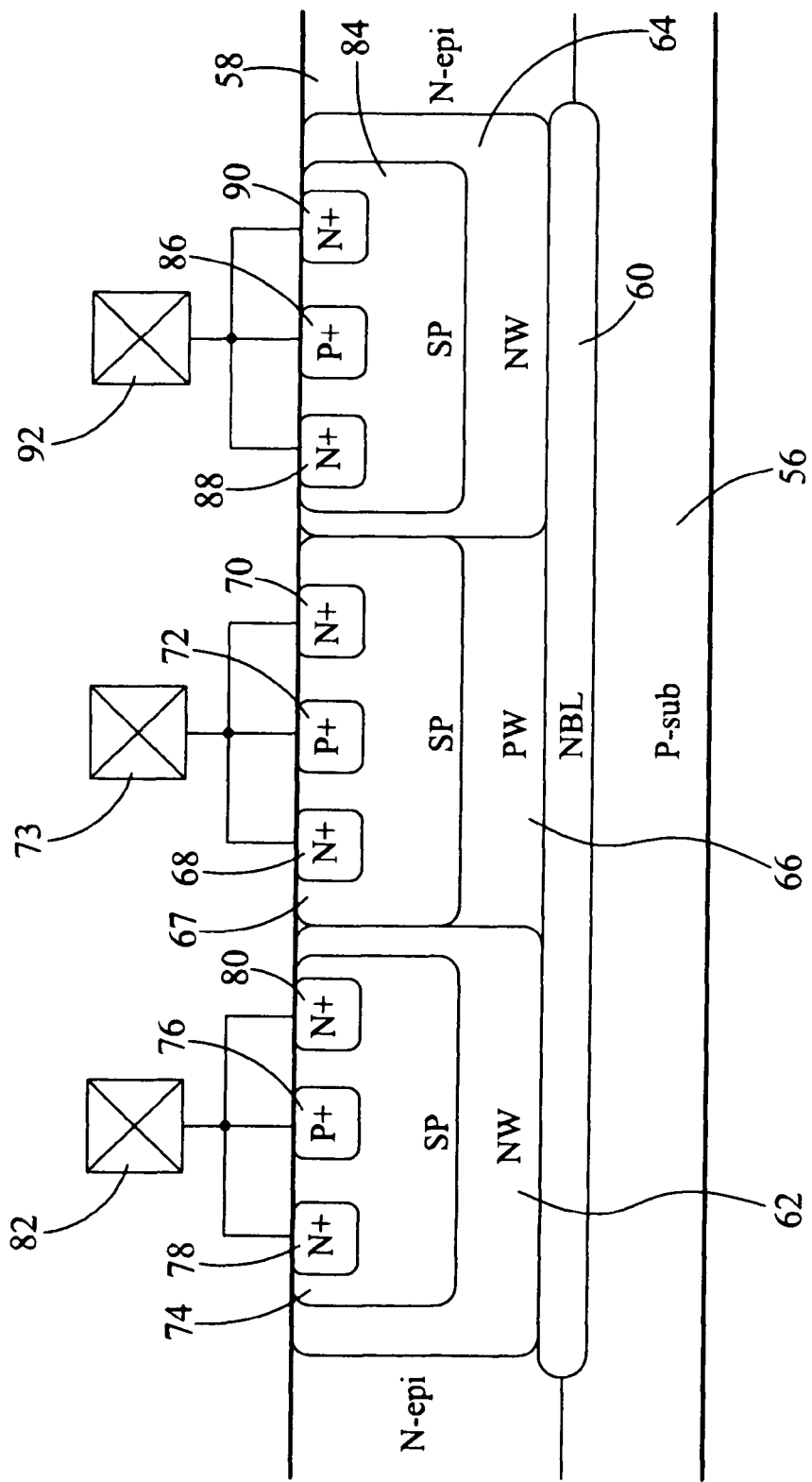
FIG. 8A is a diagram schematically showing one aspect of an eighth embodiment of the present invention.

Refer to FIG. 8A a diagram schematically showing one aspect of an eighth embodiment of the present invention. In this aspect of the eighth embodiment, the bidirectional PNPN SCR of the present invention comprises a P-type substrate 56. An N-type epitaxial layer 58 is formed on the P-type substrate 56. An N-type buried layer 60 is formed in the junction between the P-type substrate 56 and the N-type epitaxial layer 58. Two N-type wells 62 and 64 and a P-type well 66 are formed over the N-type buried layer 60 and inside the N-type epitaxial layer 58, and the P-type well 66 is interposed between the N-type wells 62 and 64.

A middle P-type doped area 67 is formed inside the P-type well 66. The middle P-type doped area 67 has two N+ semiconductor areas 68 and 70 and a P+ semiconductor area 72. The N+ semiconductor areas 68 and 70 and the P+ semiconductor area 72 are all coupled to an anode 73.

A P-type doped area 74 is formed inside the N-type well 62. The P-type doped area 74 has a P+ semiconductor area 76 and two N+ semiconductor areas 78 and 80 respectively at two sides of the P+ semiconductor area 76. The P+ semiconductor area 76 and the N+ semiconductor areas 78 and 80 are all coupled to a cathode 82.

A P-type doped area 84 is formed inside the N-type well 64. The P-type doped area 84 has a P+ semiconductor area 86 and two N+ semiconductor areas 88 and 90 respectively at two sides of the P+ semiconductor area 84. The P+ semiconductor area 86 and the N+ semiconductor areas 88 and 90 are all coupled to a cathode 92.

Figure 8B:
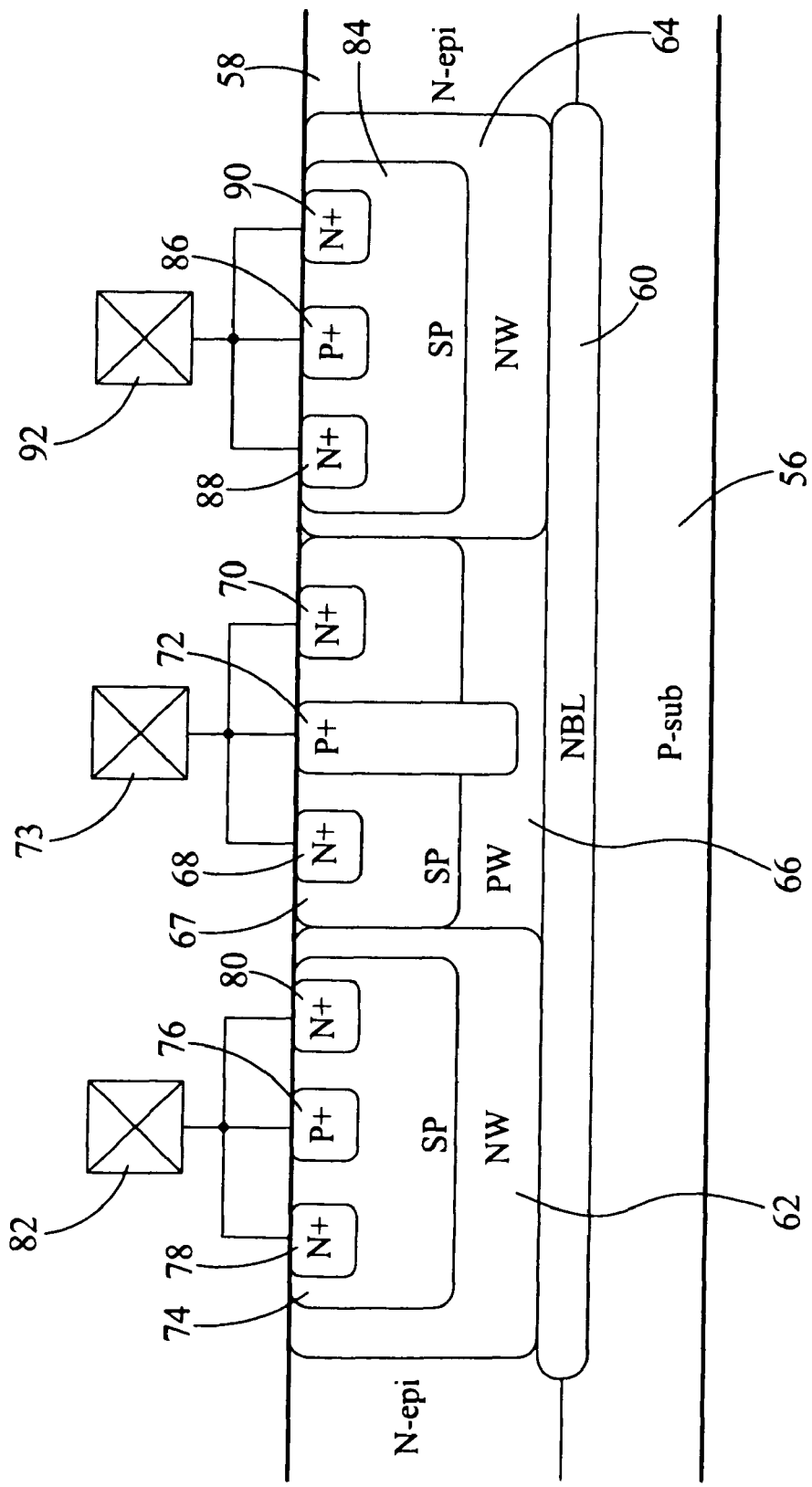
FIG. 8B is a diagram schematically showing another aspect of the eighth embodiment of the present invention.

Refer to FIG. 8B a diagram schematically showing another aspect of the eighth embodiment of the present invention, wherein the P+ semiconductor area 72 extends through the interface between the middle P-type doped area 67 and the P-type well 66.

In conclusion, the present invention discloses a bidirectional PNPN SCR whose elements can be fabricated with a deep-submicron semiconductor technology. Thus, the area of SCR can be greatly reduced in the present invention. Further, the bidirectional PNPN SCR of the present invention has a high ESD resistance. Furthermore, the bidirectional PNPN SCR of the present invention has an adjustable trigger voltage and an adjustable hold voltage and can be applied to all process generations. Therefore, the present invention can be effectively integrated into a high voltage device. Besides, the bidirectional PNPN SCR of the present invention has a low parasitic capacitance and a high ESD resistance. Therefore, in the present invention, the influence of SCR parasitic capacitance on the operational speed of the circuit is greatly reduced.

Those described above are only the preferred embodiments to exemplify the present invention but not to limit the scope of the present invention. Any equivalent modification or variation according to the characteristics or spirit of the present invention is to be also included within the scope of the present invention.

What is claimed is:

1. A bidirectional PNPN silicon-controlled rectifier comprising:
    a P-type substrate;
    a N-type epitaxial layer formed on said substrate;
    a P-type middle doped area and two N-type wells all formed inside said N-type epitaxial layer with said two N-type wells respectively arranged at two sides of said P-type middle doped area;
    a first semiconductor area, a second semiconductor area and a third semiconductor area all formed inside said P-type middle doped area and all coupled to an anode, wherein said first semiconductor area is arranged in between said second semiconductor area and said third semiconductor area, and wherein a conduction type of said first semiconductor area is opposite to that of said second and third semiconductor area; and
    two P-type doped areas respectively formed inside said N-type wells and arranged at two sides of said P-type middle doped area, wherein each said P-type doped area has a fourth semiconductor area neighboring said P-type middle doped area and a fifth semiconductor area, and wherein both said fourth semiconductor area and said fifth semiconductor area are coupled to a cathode, and wherein a conduction type of said fourth semiconductor area is opposite to that of said fifth semiconductor area.

2. A bidirectional PNPN silicon-controlled rectifier according to claim 1, wherein each said P-type doped area further has a sixth semiconductor area, which is arranged at an outer side of said fifth semiconductor area and has a conduction type identical to that of said fourth semiconductor area.

3. A bidirectional PNPN silicon-controlled rectifier according to claim 1, wherein said first semiconductor area extends through an interface between said P-type middle doped area and said N-type epitaxial layer.

* * * * *